(12) United States Patent
Leshchiner

(10) Patent No.: US 9,137,337 B2
(45) Date of Patent: *Sep. 15, 2015

(54) HIERARCHICAL BITMASKS FOR INDICATING THE PRESENCE OR ABSENCE OF SERIALIZED DATA FIELDS

(71) Applicant: TIBCO Software, Inc., Palo Alto, CA (US)

(72) Inventor: Dan Leshchiner, Sunnyvale, CA (US)

(73) Assignee: TIBCO Software Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/300,051

(22) Filed: Jun. 9, 2014

(65) Prior Publication Data

US 2014/0289427 A1    Sep. 25, 2014

Related U.S. Application Data

(63) Continuation of application No. 13/298,236, filed on Nov. 16, 2011, now Pat. No. 8,751,671.

(60) Provisional application No. 61/414,342, filed on Nov. 16, 2010.

(51) Int. Cl.
*G06F 15/16* (2006.01)
*H04L 29/06* (2006.01)
*H03M 7/30* (2006.01)

(52) U.S. Cl.
CPC .............. *H04L 69/04* (2013.01); *H03M 7/30* (2013.01); *H03M 7/3066* (2013.01)

(58) Field of Classification Search
CPC ...................................................... H04L 69/04
USPC ............................................................ 709/228
See application file for complete search history.

(56) References Cited

U.S. PATENT DOCUMENTS

| | | |
|---|---|---|
| 2004/0077345 A1 | 4/2004 | Turner et al. |
| 2005/0021622 A1 | 1/2005 | Cullen |
| 2005/0083944 A1 | 4/2005 | Liu et al. |
| 2008/0089339 A1 | 4/2008 | Tsirtsis et al. |

(Continued)

FOREIGN PATENT DOCUMENTS

WO    2012068301    5/2012

OTHER PUBLICATIONS

International search report and written opinion of the international searching authority from PCT application No. PCT/US2011/061064 mailed Jun. 29, 2012.

*Primary Examiner* — Shaq Taha
(74) *Attorney, Agent, or Firm* — Baker & McKenzie LLP

(57) ABSTRACT

Disclosed are systems and methods for communicating with a sender machine and a receiver machine, and analyzing a bitmask associated with a message to be sent from the sender machine to the receiver machine, such that the bitmask comprises one or more presence bits and one or more absence bits, such that the presence bits indicate that an associated field of the message are included in the message and the absence bits indicate that an associated field of the message are omitted in the message. The systems and methods also dynamically determine compression instructions to compress the bitmask, and provide the compression instructions to the sender machine, wherein the compression instructions reduce size of the bitmask associated with the message to be sent to the receiver machine.

20 Claims, 3 Drawing Sheets

(56) References Cited

U.S. PATENT DOCUMENTS

| | | | |
|---|---|---|---|
| 2008/0089357 A1* | 4/2008 | Park et al. | 370/465 |
| 2008/0270542 A1 | 10/2008 | Tu et al. | |
| 2009/0037514 A1 | 2/2009 | Lankford et al. | |
| 2009/0165074 A1 | 6/2009 | Elstermann et al. | |
| 2010/0085253 A1* | 4/2010 | Ferguson et al. | 342/357.15 |

* cited by examiner

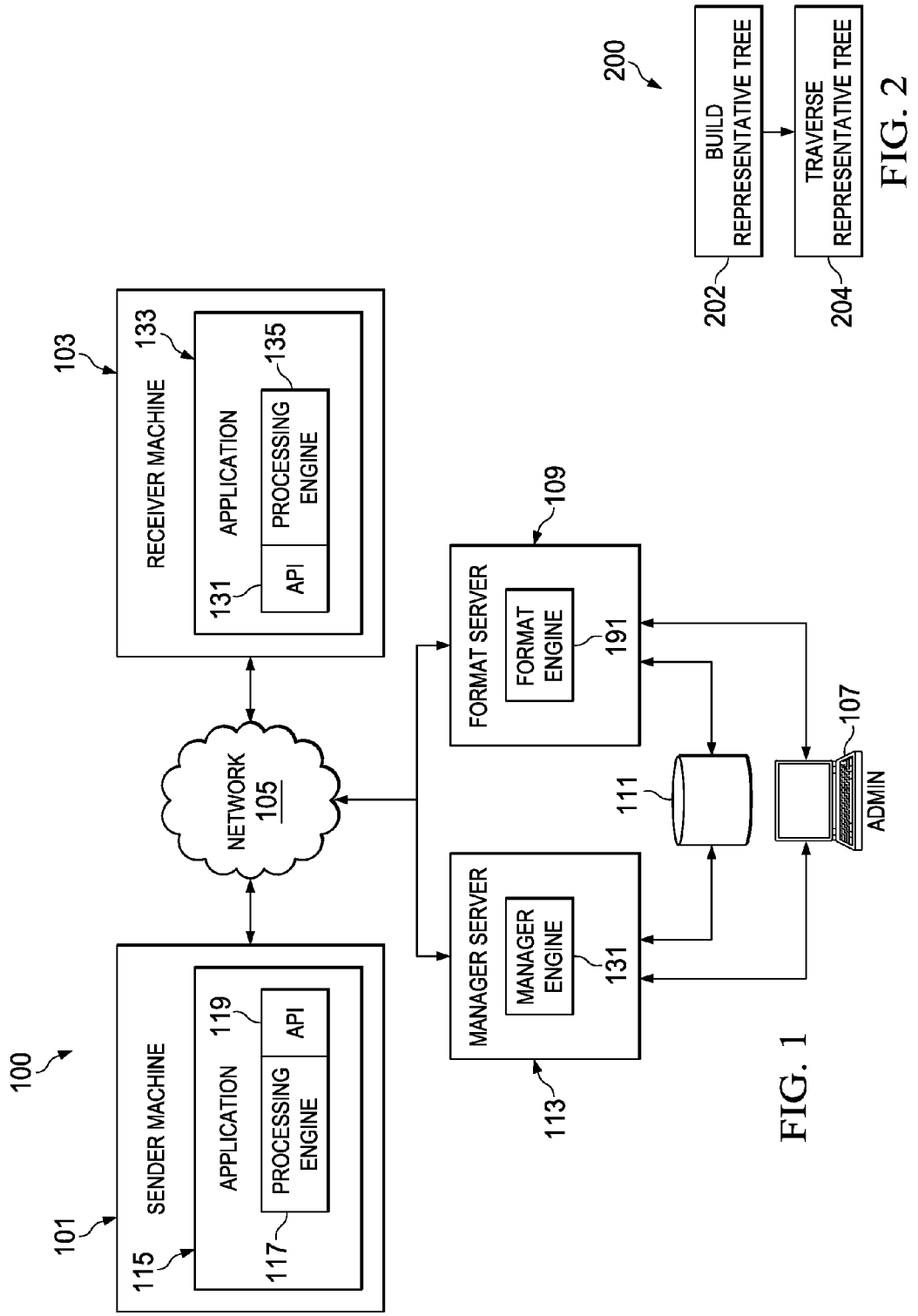

```
defn decompress (level) {
    if (level == 1) {
        /* Copy leaf */
        Append cbitmask[index .. index + k - 1] to bitmask[]
        index = index + k
    }
    else {
        /* Process bits in interior node */
        myindex = index
        index = index + k
        for (i = myindex; i < myindex + k; i++)
            if (cbitmask[i] == 0)
                append k$^{level-1}$0's to bitmask[]
            else
                decompress (level - 1)
```
FIG. 6
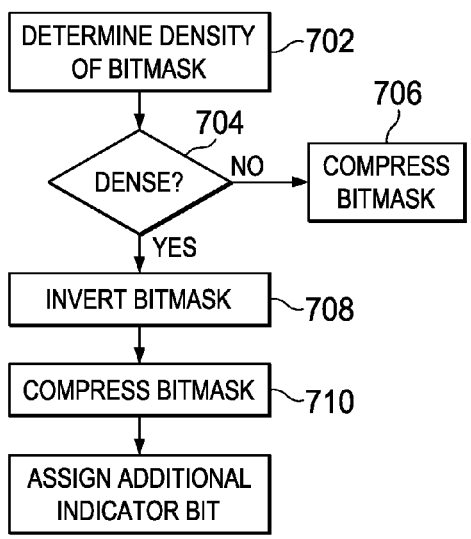
FIG. 7
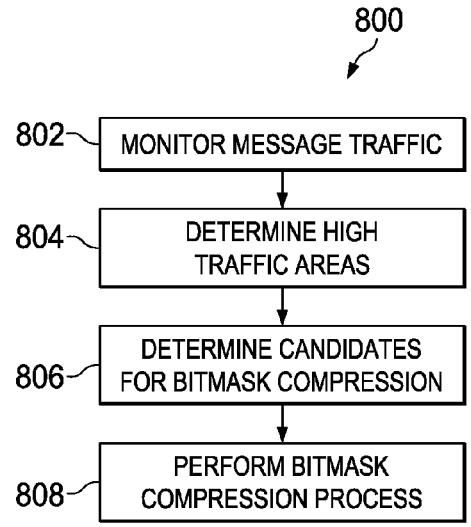
FIG. 8

HIERARCHICAL BITMASKS FOR INDICATING THE PRESENCE OR ABSENCE OF SERIALIZED DATA FIELDS

CROSS REFERENCE TO RELATED APPLICATIONS

This application is a continuation of and claims priority to U.S. patent application Ser. No. 13/298,236 entitled "Hierarchical bitmasks for indicating the presence or absence of serialized data fields," filed on Nov. 16, 2011, that is a non-provisional of and claims priority to U.S. Provisional Patent Application No. 61/414,342 entitled "Hierarchical bitmasks for indicating the presence or absence of serialized data fields," filed on Nov. 16, 2010, both of which are hereby incorporated by reference in their entirety.

TECHNICAL FIELD

The disclosed embodiments relate generally to data compression and, more specifically, relate to a hierarchical approach for compressing and decompressing bitmasks.

BACKGROUND

Typical servers and communication systems do not provide efficient implementations to limit or decrease the size of transmissions, which may cause the network to become congested. Typically, all of the information of a transmission is necessarily passed through the network. Without data compression, expensive resources are continuously consumed with every message, including storage space and transmission bandwidth. Bitmasks or other methods may be used to decrease the size of messages sent in transmissions, but bitmasks have overhead that increases the size of each compressed message. The additional size of bitmasks appended to each message may consume expensive resources and negatively affect communication speed. The need has arisen to provide a method and system for compressing the bitmasks associated with messages to address the issues of consuming expensive resources, communication speed, and network congestion.

SUMMARY

According to an aspect of this disclosure, systems are described for compressing and decompressing bitmasks. The systems may also include a sender machine and a receiver machine for compressing, sending, receiving, and decompressing the bitmask across a network or data pipeline.

According to another aspect of this disclosure, methods are described for compressing bitmasks and decompressing bitmasks. The methods may include building a representative tree and traversing the representative tree using a bitmask of n-bits. The methods may further include creating nodes at a first level for a number of bits in the bitmask and aligning the nodes in a certain level of the representative tree while retaining the original left-to-right ordering of the bits in the bitmask. The methods may further include creating a parent level based on the first level or creating a new parent level based on the parent level, etc.

The methods may further include creating an empty buffer and traversing the tree. For each non-zero node in the tree, the value of the node is appended to the buffer. The methods may further include optimizing a compressed bitmask by minimizing the number of bits used to represent strings of zeroes, inverting a bitmask to convert a dense bitmask to a sparse intermediate bitmask, and/or inverting the compression and decompression algorithms to compress and decompress strings of ones rather than zeroes. Methods may further include ordering fields of the bitmask to group zero fields together.

According to another aspect of this disclosure, methods are disclosed for decompressing a bitmask. The methods may include traversing compressed bitmask copying leaf nodes and reconstructing interleaving runs of zeroes by deducing zero sub-trees.

BRIEF DESCRIPTION OF THE DRAWINGS

FIG. 1 is a schematic diagram of an example system for compressing bitmasks, in accordance with the present disclosure;

FIG. 2 is a flow diagram illustrating a process for compressing bitmasks, in accordance with the present disclosure;

FIG. 6 is a schematic diagram illustrating an exemplary recursive routine for decompressing a bitmask, in accordance with the present disclosure;

FIG. 7 is a flow diagram illustrating optimizing bitmask compression, in accordance with the present disclosure; and FIG. 8 is a flow diagram illustrating a process for dynamic or adaptive bitmask compression, in accordance with the present disclosure.

DETAILED DESCRIPTION

Figure 3:
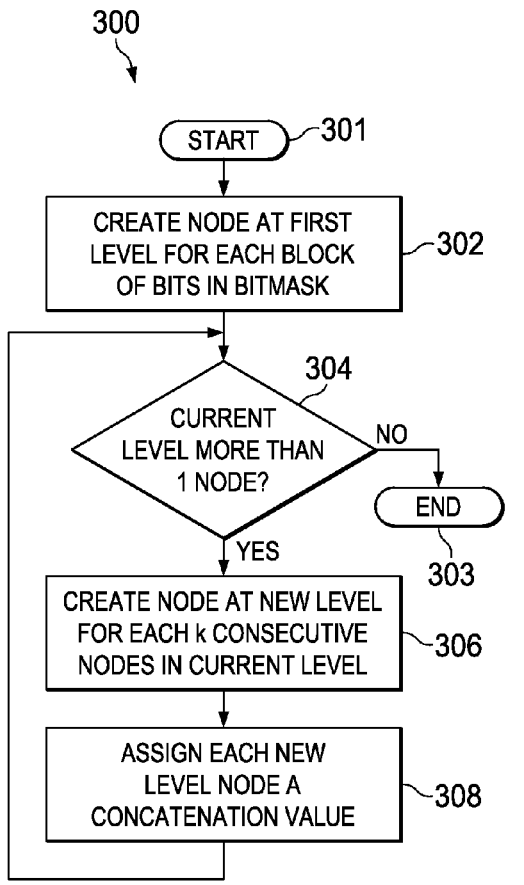
FIG. 3 is a flow diagram illustrating a process for building a representative tree, in accordance with the present disclosure.

Methods and systems are described below for a system that allows for the transmission of bitmasks in compressed form and for decompression of the bitmasks upon receipt of affected messages. In an embodiment, this is exemplified in the realm of message-based middleware. These embodiments save message buffer space rendering sender/receiver message systems more efficient.

When parties in a network, distributed computing system, cloud computing system, or any other sender/receiver message system (e.g., a sender machine and receiver machine in a message-oriented middleware system) agree on an ordered field-based message format and a method for encoding such a message into a linear buffer, buffer space may be saved by omitting fields for which no value is specified, or for which the value is unchanged from the previous message in the sequence.

When omitting fields out of a pre-arranged field set, the sender machine may include a bitmask to indicate which fields are present or to indicate which fields are unchanged from the previous message in the sequence. For example, a bitmask for a message with 64 fields can be represented by a sequence of 64 bits with each bit indicating the presence (e.g., bit=1) or absence (e.g., bit=0) of the sequentially ordered fields. Thus, the bitmask may be encoded in 8 bytes and sent by a sender machine across a data pipeline or network to a receiving machine. A receiver machine can combine the bitmask, message field definitions, and the message buffer to reconstruct the original message.

The bitmask may be used to indicate presence or absence of information, depending on whether the message has few fields or many—i.e., in some modes a 1-bit may indicate the presence of information while the 0-bit may indicate the absence of information; in other modes the opposite is true. A bitmask can indicate which mode is being used by signaling an extra bit or out-of-band. As discussed below, a sparser bitmap (with large runs or contiguous extents of 0-bits) typically results in a better bitmask compression.

While bitmasks save buffer space by allowing absent or unchanged data fields to be omitted, the bitmasks themselves also take space. A system and process for compacting bitmasks via a hierarchical representation are disclosed and this compression and decompression scheme produces especially good results for bitmasks that are relatively sparse (few ones, many zeroes) and concentrated (ones in contiguous positions).

FIG. 1 is a schematic diagram illustrating an example system 100 allowing for sender machines 101 and receiver machines 103 to send and receive compressed bitmasks. The system 100 may include a sender machine 101, a receiver machine 103, a network 105, manager server 113, format server 109, data store 111, and administrator machine 107. The sending machine 101 and the receiving machine 103 may include a message application 115, 133 that may include an application programming interface ("API") 119, 131 as an interface for communicating messages and a message processing engine 117, 135 for processing messages. Message application 115 of sender machine 101 and message application 133 of receiver machine 103 may include bitmask compressing/decompressing engines (not shown) in communication with one or more elements of system 100, including format server 109 and manager server 113.

Manager server 113 is a server configured to analyze data flow in the system and may determine bottlenecks or opportunities for improved efficiencies in the system (for example, by re-ordering data fields for enhanced bitmask compression or by introducing bitmask compression for a set of data messages). Manager server 113 may include a manager engine 131 for processing or executing the manager server analysis, calculations, re-ordering, etc. Thus, Sender machine 101 and receiver machine 103 may not communicate with the manager server 113 for every bitmask compression and decompression task. In an embodiment, sender machine 101 and receiver machine 103 communicate with the manager server 113 when determining a re-ordering of data fields for enhanced bitmask compression and/or for determining good data message set candidates for bitmask compression and decompression.

Format server 109 and a format engine 191 are configured to establish an agreement on message formats between sender machine 101 and receiver machine 103. This agreement may be established outside of the context of bitmask compression and, thus, in an embodiment, sender machine 101 and receiver machine 103 may not communicate with the format server 109 for bitmask compression and decompression tasks. In an embodiment, sender machine 101 and receiver machine 103 may communicate with format server 109 when sender machine 101 and receiver machine 103 wish to encode/decode format information in a message or set of messages.

Although format server 109 and manager server 113 are illustrated as separate servers in FIG. 1, format server 109 and manager server 113 may be a single server, a set of multiple servers acting as a single servers, etc. Although not illustrated, in some embodiments, a message-based middleware may be in communication with the sender machine 101 and the receiver machine 103 to facilitate the transmission of messages. In an embodiment, an administrator machine 107 may be in communication with the manager server 113, allowing an administrator to alter settings of the manager server 113 and, in an embodiment, the settings of the bitmask compression engine in the applications 115.

Sender machine 101 and receiver machine 103 allow for transmission of bitmasks in compressed form by processing and executing bitmask compression and decompression algorithms (at application processing elements 117, 135) for system 100. This functionality provides performance dividends when a high number of messages where bitmask compression is significant relative to the size of present fields are communicated.

While illustrated as a single sender machine 101 in FIG. 1, system 100 may comprise more than one sender machine 101. Although described as sender machine 101 in FIG. 1, sender machine 101 may receive messages in some embodiments. While illustrated as a single receiver machine 103 in FIG. 1, system 100 may comprise more than one receiver machine 103. Although described as receiver machine 103 in FIG. 1, receiver machine 103 may generate and send messages in some embodiments. In some embodiments, sender machine 101 and receiver machine 103 may be the same machine, such that it can receive and send messages.

In some embodiments, prearranged compression formats are optionally established at the format server 109. The message may be created and compressed at sender machine 101, in which the compressed message is sent to the receiver machine 103 via network 105, and the message may be decompressed at the receiver machine 103. In some embodiments, manager server 113 analyzes data flow to determine optimal ordering of data fields. In some embodiments, format server 109 and manager server 113 may monitor one or more messages communicated between one or more sender machines 101 and receiver machines 103 and dynamically determine a compression format to compress messages prior to being sent by the one or more sender machines 101.

Sender machine 101 may use API 119 calls to construct the compressed message which may then be sent to the receiver machine 103 via network 105. The compressed message may consist of two parts: 1) the compressed bitmask and 2) the fields themselves. Receiver machine 103 may receive the compressed message and use 1) the prearranged format; 2) the compressed bitmask; and 3) the compressed fields in order to reconstruct the bitmask and interpret the data portion of a buffer. In an embodiment, multiple servers 113 and 109 may be used to establish an agreed format between sender machine 101 and receiver machine 103 and for analyzing data flows and ordering of data fields.

Network 105 may represent any form of communication network supporting circuit-switched, packet-based, and/or any other suitable type of communications between sender machine 101, receiver machine 103, format server 109, manager server 113, and any other elements in FIG. 1. Network 105 may additionally include any other nodes of system 100 capable of transmitting and/or receiving information over a communication network. Although shown in FIG. 1 as a single element, network 105 may represent one or more separate networks (including all or parts of various different networks) that are separated and serve different respective elements illustrated in FIG. 1. Network 105 may include routers, hubs, switches, firewalls, content switches, gateways, call controllers, and/or any other suitable components in any suitable form or arrangement. Network 105 may include, in whole or in part, one or more secured and/or encrypted Virtual Private Networks (VPNs) operable to couple one or more network elements together by operating or communicating over elements of a public or external communication network. In general, network 105 may comprise any combination of public or private communication equipment such as elements of the public switched telephone network (PSTN), a global computer network such as the Internet, a local area network (LAN), a wide area network (WAN), or other appropriate communication equipment. In some embodiments, network 105 may not be used if all of the components are located on the same machine. In an embodiment, sender machine 101 and receiver machine 103 may communicate through peer-to-peer (P2P) communications over network 105.

System 100 may comprise sender machine 101, receiver machine 103, format server 109, and manager server 113, each of which may be any suitable computing device comprising a processor and a memory to perform the described functionality. Sender machine 101, receiver machine 103, format server 109, and manager server 113 may comprise one or more machines, workstations, laptops, blade servers, server farms, and/or stand-alone servers. Sender machine 101, receiver machine 103, format server 109, and manager server 113 may include any hardware and/or controlling logic used to communicate information to and from one or more elements illustrated in FIG. 1. For example, sender machine 101, receiver machine 103, format server 109, and manager server 113 may be operable to receive and process data of different types that may be transmitted via different protocols or formats. Other elements in FIG. 1 may also comprise hardware and/or controlling logic to communicate information to and from one or more elements illustrated in FIG. 1. Memory may store any suitable information. Memory may comprise any collection and arrangement of volatile and/or non-volatile components suitable for storing data. For example, memory may comprise random access memory (RAM) devices, read only memory (ROM) devices, magnetic storage devices, optical storage devices, and/or any other suitable data storage devices. In particular embodiments, memory may represent, in part, computer-readable storage media on which computer instructions and/or logic are encoded. Memory may represent any number of memory components within, local to, and/or accessible by processor. Processor may represent and/or include any form of processing component, including general purpose computers, dedicated microprocessors, or other processing devices capable of processing electronic information. Examples of processor include digital signal processors (DSPs), application-specific integrated circuits (ASICs), field-programmable gate arrays (FPGAs), and any other suitable specific or general purpose processors.

FIG. 2 is a high-level flow diagram illustrating a process 200 for compressing bitmasks. Assuming that a system is compressing a bitmask of n-bits (e.g., n=27 for a bitmask containing 27 bits), an appropriate block size, k (k≥2), is selected (e.g., if k=3, then the bitmask containing 27 bits may be divided into nine blocks of 3 bits) for building a representative tree. The process 200 for compressing bitmasks includes building a representative tree at action 202 and traversing the representative tree to build the compressed bitmask at action 204. Actions 202 and 204 are described in further detail below in reference to FIGS. 3 and 4 (respectively).

FIG. 3 is a flow diagram illustrating a process 300 for building a representative k-ary tree (where k=block size). In an embodiment, the sender machine 101 of FIG. 1 is operable to perform the actions in process 300. The process 300 starts at action 301. A node is created for each successive block of k bits in the n-bit bitmask at action 302. The nodes are arranged in a first level of the representative tree in the original left-to-right ordering of the bits. This first level at action 302 makes up the leaves of the representative tree.

At decision block 304, whether the current level (for the first iteration, the first level) has more than one node is determined. If the current level has more than one node, then a new level is created and nodes are created at the new level for each k consecutive nodes in the current level at action 306. In an embodiment, if the number of nodes at the current level is not a power of k, then the nodes at the current level may be padded with nodes whose values are k zeroes. In another embodiment, the original bitmask of n-bits is padded with zeroes until its length is a power of k.

The new level nodes are assigned a value calculated as a concatenation of bits at action 308. In other words, each bit in each new level node is calculated by determining the logical OR of one current level node's bits. Certain actions in the process are repeated, except that the new level is considered the current level at the next iteration, until the current level has one node at decision block 304. When the current level only has one node the process ends at block 303.

Figure 4:
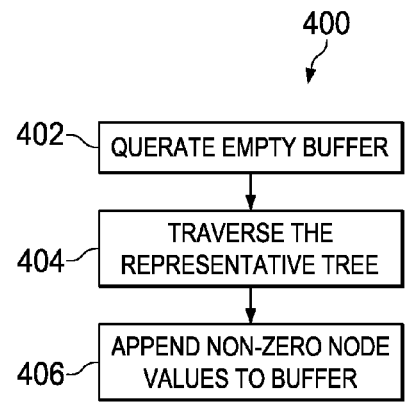
FIG. 4 is a flow diagram illustrating a process for traversing the representative tree to build a compressed bitmask, in accordance with the present disclosure.

FIG. 4 is a flow diagram illustrating a process 400 for traversing the representative tree to build a compressed bitmask. In an embodiment, the sender machine 101 of FIG. 1 is operable to perform the actions in process 400. An empty buffer is generated at action 402. The representative tree is traversed at action 404. In an embodiment, preorder visitation mechanism is used to traverse the representative tree at action 404, but other methods of tree traversal may be used. Preorder traversal includes traversing the root and then the sub-tree of the root in the order given (e.g., left to right). At each node in the representative tree, if the node's value is non-zero, the value of that node is appended to the buffer at action 406. The remainder of that node's sub-tree is then traversed. If the node's value is zero, then the remainder of that node's sub-tree is not traversed—i.e., the process moves to that node's parent and the preorder traversal continues.

For example, consider an n=27, k=3 bitmask (27-bit bitmask with a block size of 3) having the following bits: 101001000000000000000011011. Following the process discussed in FIG. 3, nodes are created for each successive block of k bits in the n-bit bitmask at action 302. The example above contains nine successive blocks of k bits, so nine nodes are created. The nodes are arranged in a first level of the representative tree in the original left-to-right ordering of the bits. This first level makes up the leaves of the representative tree.

Figure 5:
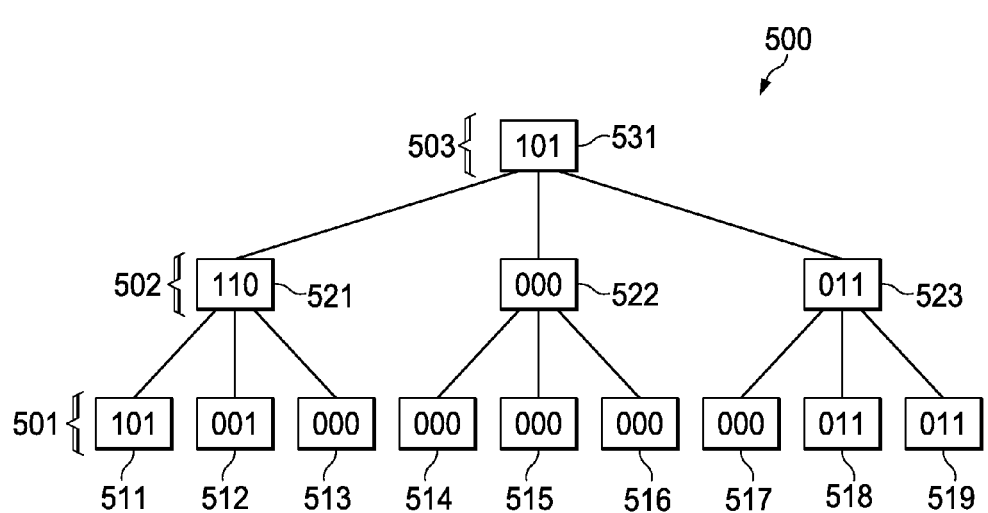
FIG. 5 is a schematic diagram of a representative tree, in accordance with the present disclosure.

FIG. 5 is a schematic diagram of a representative tree 500. A first level 501 is indicated and contains the nine created nodes discussed in the example above.

Referring back to FIG. 3, at decision block 304, it is determined that the current level (which, for the first iteration is the first level) has nine nodes. Thus, the current level has more than one node and a new level is created with nodes for each k consecutive nodes in the current level at action 306. In this example, the number of nodes at the current level is a power of n, and the new level is not padded with nodes containing zeroes. The current level has nine nodes (or, three k consecutive nodes), so three nodes are created in the new level.

Referring back to FIG. 5, the new level created is level 502, which contains three nodes.

Referring back to FIG. 3, the new level nodes are assigned a value calculated as a concatenation of bits at action 308. As discussed above, each bit in each new level node is calculated by determining the logical OR of one current level node's bits.

Referring back to FIG. 5, in the present example, the bits in the nodes of new level 502 are determined by determining the logical OR of each of the current level 501 nodes' bits. For the left-most node in the new level 502, the left-most bit is determined by the logical OR of the left-most node in the current level 501. The logical OR of the left-most node in the current level 501 is 1, so the left-most bit in the left-most node in the new level 502 is set to 1. The logical OR is determined for each node in the current level 501 allowing for each bit in the nodes in the new level 502 to be similarly determined.

Referring back to FIG. 3, as discussed above, certain actions in the process may be repeated, except that the new level is considered the current level at the next iteration, until the current level has one node at decision block 304. When the current level only has one node, the process ends at block 303.

Referring back to FIG. 5 and the present example, the new level 502 is now considered the current level at the next iteration. Thus, for the next iteration, the current level is level 502 and the new level is level 503.

Referring to both FIG. 3 and FIG. 5, at decision block 304, it is determined that the current level 502 has three nodes. Thus, the current level 502 has more than one node and a new level 503 is created with nodes for each k consecutive nodes in the current level 502 at action 306. The current level 502 has three nodes (or, one k consecutive node), so one node is created in the new level 503. The action 308 for determining the bit values in the node in new level 503 are performed and the new level 503 is considered the current level in the next iteration. Because the current level 503 has one node, the process ends during this iteration at block 303.

As discussed above in relation to FIG. 4, to encode the tree as a representative compressed bitmask, the representative tree is traversed. In an embodiment, the tree is traversed in preorder, but other orders may also be used.

Referring to FIG. 4 and FIG. 5, an empty buffer is generated at action 402. Starting at the root node 531, the tree is traversed at action 404 and the non-zero content is recorded in the buffer for the compressed bitmask at action 406. Thus, for present example, the non-zero root node 531 is recorded followed by the non-zero parent node 521 and non-zero child nodes from left to right 511 and 512 in the left-most sub-tree. Moving from left to right, the next sub-tree is the all zero parent node 522 sub-tree. Thus, as discussed above in relation to FIG. 4, the remainder of that node's sub-tree is not traversed this entire sub-tree (containing nodes 522, 514, 515, and 516) is skipped, with no values recorded. Moving from left to right, the next sub-tree is based on non-zero parent node 523. Thus, the non-zero parent node 523 and non-zero child nodes from left to right (518, 519) in the right-most sub-tree are recorded. The buffer now contains the compressed bitmask: 101 110 101 001 011 011 011. The compressed bitmask includes 21 bits instead of the original 27 bits. Compressing a single bitmask from 27 down to 21, when the bitmask is sent numerous times over a network, achieves unexpected improvements in system efficiency. It follows that compressing small amounts of data (e.g., around 1000 bytes or less) sent numerous times over a networks, using the processes disclosed herein, results in unexpected efficiency improvements over known data compression techniques.

FIG. 6 is a schematic diagram illustrating an exemplary recursive routine for decompressing a bitmask. The routine in FIG. 6 decompresses the bitmask directly from a compressed bitmask in a single pass traversal. This efficient decompression is made possible by utilizing preorder traversal on the compression side. Assuming that the compressed bitmask is in the array cbitmaskH, and that arrays are indexed starting at 0, the decompressed bitmask can be reproduced in the array bitmaskH via a call to the recursive routine in FIG. 6. The routine is called to begin the decompression with the root of the tree, and the global variable index is used to step through the bitmask[ ] array (index=0; bitmask=[ ]; decompress($\log_k$ n)).

As discussed above, the processes for compressing a bitmask minimize the number of bits needed to represent strings of zeroes. This is accomplished by skipping sub-trees composed entirely of zeroes. This works well when the original bitmask is sparse, with many zeroes and few ones. When the bitmask is dense—many ones and few zeroes—the original bitmask may be inverted with a bitwise ones' complement to convert the dense bitmask to a sparse intermediate bitmask. E.g., 11101101111 becomes 00010010000.

FIG. 7 is a flow diagram illustrating a process 700 for optimizing bitmask compression. In an embodiment, a sender machine 101 as seen in FIG. 1 is operable to perform the actions in process 700. The process 700 includes determining the density of a bitmask at decision block 702. In an embodiment, density may be determined by examining the ratio of 1's to 0's and if that ratio exceeds a configured threshold, then the bitmask is considered dense. If the original bitmask is not dense (at decision block 704), then the bitmask is compressed and decompressed in accordance with the methods discussed above in relation to FIGS. 2-6. If the original bitmask is dense, the bitmask is inverted at action 708. Then the inverted bitmask is compressed and decompressed in accordance with the methods discussed above in relation to FIGS. 2-6 (at action 710). The decompressed output given at action 710 is a bitwise ones' complement of the original bitmask. So, to indicate to the receiver machine 103 as seen in FIG. 1 whether a final ones' complement should be used, an additional bit is assigned during message transmission (action 712) to indicate whether the compressed bitmask is in original form or in the ones' complement form.

A second method of implementing this optimization would be to invert the compression algorithm itself such that it compresses strings of ones, rather than strings of zeroes. This would produce the substantially the same level of compression, and would use an indicator bit to signal the receiver that the decompression semantics should be likewise inverted.

As noted, the bitmask compression and decompression processes and systems discussed herein minimize the number of bits used to represent sub-trees composed entirely of zeroes. When these bits represent data (such as fields in a message) that can be reordered, the compression performance may be improved by grouping together data most likely to be present (that is, represented by 1-bits in the bitmask). In the case of message formats (pre-arranged ordered collection of fields), for example, fields that are commonly present in a message may be sorted to the front, leaving long, compressible strings of zeroes on the tail of the bitmask.

In a managed messaging system, the ordering of the fields may be manually specified by the format's creator or an administrator in communication with a manager server. The field ordering may also be automatically managed via dynamic analysis of traffic by the manager server. This latter approach would allow a system to tune its bitmask compression to follow changes in message traffic.

FIG. 8 is a flow diagram illustrating a process 800 for dynamic or adaptive interaction between a manager server, a manager engine, a sender machine, and a receiver. The manager server may monitor the message traffic over a network or data pipeline at action 802 and may determine one or more high traffic areas in the network or data pipeline at action 804. The manager server may determine candidates for bitmask compression at action 806. Action 806 may also include determining candidates for reordering of message fields. Action 806 may also include determining frequently sent bitmasks and the potential throughput savings using a bitmask compression and decompression process. The format server may dynamically determine new field ordering for a format and distribute this new setting to compressing engines at action 808.

While various embodiments have been described above, it should be understood that they have been presented by way of example only, and not limitation. Thus, the breadth and scope of a preferred embodiment should not be limited by any of the above described exemplary embodiments, but should be defined only in accordance with the claims and their equivalents for any patent that issues claiming priority from the present provisional patent application.

For example, as referred to herein, a machine or engine may be a virtual machine, computer, node, instance, host, or machine in a networked computing environment. Also as referred to herein, a networked computing environment is a collection of machines connected by communication channels that facilitate communications between machines and allow for machines to share resources. Also as referred to herein, a server is a machine deployed to execute a program and may include software instances.

Resources may encompass any types of resources for running instances including hardware (such as servers, clients, mainframe computers, networks, network storage, data sources, memory, central processing unit time, scientific instruments, and other computing devices), as well as software, software licenses, available network services, and other non-hardware resources, or a combination thereof.

A networked computing environment may include, but is not limited to, computing grid systems, distributed computing environments, cloud computing environment, etc. Such networked computing environments include hardware and software infrastructures configured to form a virtual organization comprised of multiple resources which may be in geographically disperse locations.

Services and applications are described in this application using those alternative terms. Services can be java services or other instances of operating code. A service/application is a program running on a machine or a cluster of machines in a networked computing environment. Services may be transportable and may be run on multiple machines and/or migrated from one machine to another.

Various terms used herein have special meanings within the present technical field. Whether a particular term should be construed as such a "term of art," depends on the context in which that term is used. "Connected to," "in communication with," or other similar terms should generally be construed broadly to include situations both where communications and connections are direct between referenced elements or through one or more intermediaries between the referenced elements, including through the Internet or some other communicating network. "Network," "system," "environment," and other similar terms generally refer to networked computing systems that embody one or more aspects of the present disclosure. These and other terms are to be construed in light of the context in which they are used in the present disclosure and as those terms would be understood by one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A sender machine in communication with a receiver machine, wherein the sender machine is operable to:
    analyze a bitmask associated with a message to be sent from the sender machine to the receiver machine, wherein the bitmask comprises one or more presence bits and one or more absence bits, wherein the presence bits indicate that an associated field of the message are included in the message and the absence bits indicate that an associated field of the message are omitted in the message; and
    dynamically determine compression instructions to compress the bitmask, wherein determining the compression instructions comprises:
        generating a tree using the presence bits and the absence bits; and
        generating the compressed bitmask by traversing the tree comprising the presence bits and the absence bits; and
    wherein the compression instructions reduce a size of the bitmask associated with the message to be sent to the receiver machine.

2. The sender machine of claim 1, wherein the receiver machine is further operable to determine the compression instructions, and wherein the receiver machine utilizes the compression instructions to decompress the compressed bitmask of the message.

3. The sender machine of claim 1, wherein the receiver machine utilizes the compression instructions to decompress the compressed bitmask of the message.

4. The sender machine of claim 1, wherein the message is compressed according to the bit mask and the bitmask of the message is compressed according to the compression instructions.

5. The sender machine of claim 1, wherein the message may have one or more fields that are sorted to group together one or more fields likely to have a value and group together one or more fields not likely to have a value.

6. The sender machine of claim 1, wherein the sender machine is further operable to invert the bitmask prior to compressing the bitmask.

7. The sender machine of claim 1, wherein the compression instructions can be used by the receiver machine to decompress the compressed bitmask by traversing the tree, reconstructing all subtrees having an absence bit, and copying a leaf node when traversed.

8. The sender machine of claim 1, wherein the sender and receiver machines can store the compression instructions for future message compression or decompression of bitmasks sent or received by the sender and receiver machines.

9. The sender machine of claim 1, wherein the sender machine is further operable to transmit the compression instructions to the receiver machine, and wherein the receiver machine utilizes the compression instructions to decompress the compressed bitmask of the message.

10. A method for generating bitmask compression instructions, where the method comprises:
analyzing a bitmask associated with a message to be sent from a sender machine to a receiver machine, wherein the bitmask comprises one or more presence bits and one or more absence bits, wherein the presence bits indicate that an associated field of the message are included in the message and the absence bits indicate that an associated field of the message are omitted in the message;
dynamically generating compression instructions to compress the bitmask, wherein the compression instructions comprise:
generating a tree using the presence bits and the absence bits; and
generating the compressed bitmask by traversing the tree comprising the presence bits and the absence bits; and
wherein the compression instructions reduce size of the bitmask associated with the message to be sent to the receiver machine.

11. The method of claim 10, wherein the method further comprises generating the compression instructions at the receiver machine, wherein the receiver machine utilizes the compression instructions to decompress the compressed bitmask of the message.

12. The method of claim 10, wherein the message is compressed according to the bit mask, and the bitmask of the message is compressed according to the compression instructions.

13. The method of claim 10, wherein the message may have one or more fields that are sorted to group together one or more fields likely to have a value and group together one or more fields not likely to have a value.

14. The method of claim 10, wherein the method further comprises inverting the bitmask prior to compressing the bitmask.

15. The method of claim 10, wherein the compression instructions can be used by the receiver machine to decompress the compressed bitmask by traversing the tree, reconstructing all subtrees having an absence bit, and copying a leaf node when traversed.

16. The method of claim 10, wherein the receiver machine utilizes the compression instructions to decompress the compressed bitmask of the message.

17. The method of claim 10, wherein the sender and receiver machines can store the compression instructions for future message compression or decompression of bitmasks sent or received by the sender and receiver machines.

18. The method of claim 10, further comprising transmitting the compression instructions to the receiver machine, and wherein the receiver machine utilizes the compression instructions to decompress the compressed bitmask of the message.

19. Logic for providing bitmask message compression instructions, the logic being embodied in a non-transitory computer-readable medium and when executed:
analyzes a bitmask associated with a message to be sent from a sender machine to a receiver machine, wherein the bitmask comprises one or more presence bits and one or more absence bits, wherein the presence bits indicate that an associated field of the message are included in the message and the absence bits indicate that an associated field of the message are omitted in the message;
dynamically determines compression instructions to compress the bitmask, wherein the compression instructions comprise:
generating a tree using the presence bits and the absence bits; and
generating the compressed bitmask by traversing the tree comprising the presence bits and the absence bits; and
wherein the compression instructions reduce size of the bitmask associated with the message to be sent to the receiver machine.

20. The logic of claim 19, wherein the receiver machine utilizes the compression instructions to decompress the compressed bitmask of the message.

* * * * *